(12) United States Patent
Li et al.

(10) Patent No.: US 10,317,019 B2
(45) Date of Patent: Jun. 11, 2019

(54) LED ILLUMINATION DEVICE AND METHOD

(71) Applicant: TAOLIGHT COMPANY LIMITED, Hong Kong (CN)

(72) Inventors: Huahui Li, Hong Kong (CA); Jiezhao Wang, Hong Kong (CN); Yingying Zhao, Hong Kong (CN); Bertrand Delalande, Hong Kong (CN); Bruno Couthouis, Hong Kong (CN); Jean-Eudes Leroy, Hong Kong (CN); Libo Wu, Hong Kong (CN)

(73) Assignee: TAOLIGHT COMPANY LIMITED, Hong Kong (CA)

( * ) Notice: Subject to any disclaimer, the term of this patent is extended or adjusted under 35 U.S.C. 154(b) by 0 days.

(21) Appl. No.: 15/503,947

(22) PCT Filed: Aug. 22, 2014

(86) PCT No.: PCT/CN2014/085050
§ 371 (c)(1),
(2) Date: Feb. 14, 2017

(87) PCT Pub. No.: WO2016/026153
PCT Pub. Date: Feb. 25, 2016

(65) Prior Publication Data
US 2017/0241601 A1    Aug. 24, 2017

(51) Int. Cl.
*F21K 9/65*    (2016.01)
*H01L 33/48*   (2010.01)
(Continued)

(52) U.S. Cl.
CPC ............... *F21K 9/65* (2016.08); *F21K 9/232* (2016.08); *F21K 9/62* (2016.08); *F21S 10/023* (2013.01);
(Continued)

(58) Field of Classification Search
CPC .......... F21K 9/90; F21V 23/004; F21V 23/04; F21V 23/0442; F21V 29/70; F21V 29/83;
(Continued)

(56) References Cited

U.S. PATENT DOCUMENTS 8,226,264 B1 * 7/2012 Morejon ................. F21K 9/233
                                                     362/231
9,530,943 B2 * 12/2016 Cheng ..................... H01L 33/26
(Continued)

FOREIGN PATENT DOCUMENTS

CN    103175010 A    6/2013
CN    203010274 U    6/2013
(Continued)

OTHER PUBLICATIONS

International Search Report, dated May 22, 2015, for PCT/CN2014/085050, 4 pages.
(Continued)

*Primary Examiner* — Hargobind S Sawhney
(74) *Attorney, Agent, or Firm* — Seed IP Law Group LLP (57) ABSTRACT

An illumination device including an LED mounting platform (2) having a peripheral region (2a) and a relatively inner region (2b); at least one warm white LED (3) and at least one cool white LED (4) mounted adjacent the peripheral region (2a) of the LED mounting platform (2), and, at least one RGB LED (5) mounted adjacent the relatively inner region (2b) of the LED mounting platform (2); a diffusion cover (10) configured to allow light emitted from the at least one warm white LED (3), the at least one cool white LED (4), and the at least one RGB LED (5) to pass therethrough; and wherein at least one light emission characteristic of light emitted from the at least one warm white LED (3), the at least one cool white LED (4), and/or the at least one RGB LED (5) is configured to be selectably varied
(Continued)

in response to an input control signal so as to produce a plurality of lighting modes.

7 Claims, 6 Drawing Sheets

(51) Int. Cl.
| | |
|---|---|
| *F21S 10/02* | (2006.01) |
| *F21V 29/77* | (2015.01) |
| *F21K 9/232* | (2016.01) |
| *F21K 9/62* | (2016.01) |
| *F21V 29/70* | (2015.01) |
| *F21V 19/00* | (2006.01) |
| *H05B 33/08* | (2006.01) |
| *H05K 1/05* | (2006.01) |
| *F21Y 105/12* | (2016.01) |
| *F21Y 105/10* | (2016.01) |
| *F21Y 115/10* | (2016.01) |
| *F21Y 113/13* | (2016.01) |

(52) U.S. Cl.
CPC .......... *F21V 19/0015* (2013.01); *F21V 29/70* (2015.01); *F21V 29/773* (2015.01); *H01L 33/486* (2013.01); *H05B 33/0857* (2013.01); *H05K 1/053* (2013.01); *F21Y 2105/10* (2016.08); *F21Y 2105/12* (2016.08); *F21Y 2113/13* (2016.08); *F21Y 2115/10* (2016.08); *H05K 2201/10106* (2013.01); *Y02B 20/383* (2013.01)

(58) Field of Classification Search
CPC ............. F21Y 2101/00; F21Y 2105/10; F21Y 2113/13; H01L 33/504; H05B 33/08; H05B 33/0842; H05B 33/0857; H05B 37/02; H05K 2201/10106
See application file for complete search history.

(56) References Cited

U.S. PATENT DOCUMENTS

| | | | |
|---|---|---|---|
| 2007/0058377 A1 | 3/2007 | Zampini, II et al. | |
| 2011/0019399 A1* | 1/2011 | Van De Ven | F21K 9/00 362/231 |
| 2012/0286699 A1* | 11/2012 | Yan | H05B 33/0866 315/294 |
| 2013/0075769 A1* | 3/2013 | Yan | F21K 9/90 257/89 |
| 2013/0223058 A1* | 8/2013 | Briggs | F21V 21/005 362/225 |
| 2014/0084796 A1* | 3/2014 | Yan | H05B 33/086 315/151 |
| 2014/0168965 A1* | 6/2014 | Moon | H05B 33/0857 362/231 |

FOREIGN PATENT DOCUMENTS

| | | |
|---|---|---|
| CN | 203052388 U | 7/2013 |
| CN | 103234141 A | 8/2013 |
| CN | 103822146 A | 5/2014 |

OTHER PUBLICATIONS

Written Opinion, dated May 22, 2015, for PCT/CN2014/085050, 5 pages.

* cited by examiner

LED ILLUMINATION DEVICE AND METHOD

TECHNICAL FIELD

The present invention relates to compact and integrated light emitting diode (LED) illumination devices and methods for use in mood and functional lighting applications and the like.

BACKGROUND OF THE INVENTION

LED lighting systems are used in a number of lighting applications including that of providing mood and functional lighting effects. In this regard, it is desirable for an LED lamp to be capable of adjustably rendering a broad spectrum of correlated colour temperatures, brightness and other light emission characteristics which are required to provide vivid mood and functional lighting effects.

Problems exist in seeking to cost-effectively enhance LED lamps so as to exhibit mood and functional lighting performance characteristics comparable with the above requirements, whilst at the same time providing a compact-sized module having suitable and effective thermal dissipation capability in the context of the device design. For instance, whilst the correlated colour temperature spectrum may be enhanced by seeking to increase the capacity of RGB LEDs available to effect colour mixing with white light LEDs, this also results in additional design costs and complexity, and, requires additional power and thermal dissipation capacity which may not be suitably available within the constraints of a compact-sized module design. Conversely, certain LED technologies such as the Philips Hue device are implemented in the form of a compact sized LED lamp module, however, as it utilises a relatively limited range of RGB LEDs, the resulting correlated colour temperature spectrum that can be rendered, the luminous flux and beam angle, are perceived to be relatively poor.

Existing LED lighting systems also tend to utilise a switch-on switch-off approach whereby when switching from one lighting mode to another, the LED driving current in different LED output channels are changed in an instantaneous step-change to adjust the brightness and colour settings. However, effecting instantaneous change of the colour and brightness characteristics is perceived to cause discomfort for users.

SUMMARY OF THE INVENTION

The present invention seeks to alleviate at least one of the above-described problems.

The present invention may involve several broad forms. Embodiments of the present invention may include one or any combination of the different broad forms herein described.

In a first broad form, the present invention provides an illumination device including:
an LED mounting platform having a peripheral region and a relatively inner region;
at least one warm white LED and at least one cool white LED mounted adjacent the peripheral region of the LED mounting platform, and, at least one RGB LED mounted adjacent the relatively inner region of the LED mounting platform;
a diffusion cover configured to allow light emitted from the at least one warm white LED, the at least one cool white LED, and the at least one RGB LED to pass therethrough; and wherein at least one light emission characteristic of light emitted from the at least one warm white LED, the at least one cool white LED, and/or the at least one RGB LED is configured to be selectably varied in response to an input control signal so as to produce a plurality of lighting modes.

Preferably, the at least one cool white LED may be operable to represent a correlated colour temperature approximately in a range of between 4500K-7000K.

Preferably, the at least one warm white LED may be operable to represent a correlated colour temperature approximately in a range of between 2200K-3500K.

Preferably, the at least one RGB LED may be mounted substantially adjacent a central region of the LED mounting platform.

Preferably, a plurality of cool white LEDs and a plurality of warm white LEDs may be mounted adjacent the peripheral region of the LED mounting platform, and, a plurality of RGB LEDs may be mounted adjacent the relatively inner region of the LED mounting platform.

Preferably, the plurality of cool white LEDs and the plurality of warm white LEDs may be mounted in a substantially annular configuration around the peripheral region of the LED mounting platform.

Preferably, the plurality of cool white LEDs and the plurality of warm white LEDs may be mounted in alternating positions in the annular configuration.

Preferably, the LED mounting platform may include a thermally-conductive substrate including for instance a metal-core printed circuit board (MCPCB) or a ceramic printed circuit board.

Preferably, the present invention may include a heat sink configured for dissipating thermal energy from the illumination device.

Preferably, the heat sink may be thermally coupled to the LED mounting platform.

Preferably, the at least one light emission characteristic that is selectably varied may include at least one of:
(a) a chromatic characteristic of light emitted from the at least one cool white LED, the at least one warm white LED and/or the at least one RGB LED;
(b) a correlated colour temperature characteristic of light emitted from the at least one cool white LED, the at least one warm white LED and/or the at least one RGB LED;
(c) a brightness characteristic of light emitted from the at least one cool white LED, the at least one warm white LED and/or the at least one RGB LED; and
(d) a proportion of chromatic, correlated colour temperature and/or brightness characteristics of light emitted from the at least one cool white LED, the at least one warm white LED and/or the at least one RGB LED.

Preferably, the present invention may include a microcontroller configured for generating the input control signal for use in varying the at least one light emission characteristic of light emitted from the at least one warm white LED, the at least one cool white LED and/or the at least one RGB LED.

Preferably, the microcontroller may be configured to gradually vary the at least one light emission characteristic of the at least one cool white LED, the at least one warm white LED and/or the at least one RGB LED in order to switch from a first lighting mode to a second lighting mode amongst the plurality of lighting modes.

Preferably, the microcontroller may be configured to gradually vary the at least one light emission characteristic of the at least one cool white LED, the at least one warm white LED and/or the at least one RGB LED over a time period in the range of approximately 0.1-5.0 seconds.

In a second broad form, the present invention provides an illumination method including the steps of:
(i) mounting at least one warm white LED and at least one cool white LED adjacent a peripheral region of an LED mounting platform;
(ii) mounting at least one RGB LED adjacent a relatively inner region of the LED mounting platform;
(iii) providing a diffusion cover via which light emitted from the at least one warm white LED, the at least one cool white LED, and/or the at least one RGB LED is configured to pass therethrough; and
(iv) controllably varying at least one light emission characteristic of light emitted from the at least one warm white LED, the at least one cool white LED, and/or the at least one RGB LED so as to produce a plurality of lighting modes.

Preferably, the at least one cool white LED may be operable to represent a correlated colour temperature approximately in a range of between 4500K-7000K.

Preferably, the at least one warm white LED may be operable to represent a correlated colour temperature approximately in a range of between 2200K-3500K.

Preferably, the at least one RGB LED may be mounted substantially adjacent a central region of the LED mounting platform.

Preferably, a plurality of cool white LEDs and a plurality of warm white LEDs may be mounted adjacent the peripheral region of the LED mounting platform, and, a plurality of RGB LEDs may be mounted adjacent the relatively inner region of the LED mounting platform.

Preferably, the plurality of cool white LEDs and the plurality of warm white LEDs may be mounted in a substantially annular configuration around the peripheral region of the LED mounting platform.

Preferably, the plurality of cool white LEDs and the plurality of warm white LEDs may be mounted in alternating positions in the annular configuration.

Preferably, the LED mounting platform may include a thermally-conductive substrate including for instance a metal-core printed circuit board (MCPCB) or a ceramic printed circuit board.

Preferably, the present invention may include a step of dissipating thermal energy from the illumination device via a heat sink.

Preferably, the heat sink may be thermally coupled to the LED mounting platform.

Preferably, the step of controllably varying the at least one light emission characteristic may include at least one of:
(a) varying a chromatic characteristic of light emitted from the at least one cool white LED, the at least one warm white LED and/or the at least one RGB LED;
(b) varying a correlated colour temperature characteristic of light emitted from the at least one cool white LED, the at least one warm white LED and/or the at least one RGB LED;
(c) varying a brightness characteristic of light emitted from the at least one cool white LED, the at least one warm white LED and/or the at least one RGB LED; and
(d) varying a proportion of chromatic, correlated colour temperature and/or brightness characteristics of light emitted from the at least one cool white LED, the at least one warm white LED and/or the at least one RGB LED.

Preferably, a microcontroller may be configured for generating the input control signal for use in varying the at least one light emission characteristic of light emitted from the at least one warm white LED, the at least one cool white LED and/or the at least one RGB LED.

Preferably, the microcontroller may be configured to gradually vary the at least one light emission characteristic of the at least one cool white LED, the at least one warm white LED and/or the at least one RGB LED in order to switch from a first lighting mode to a second lighting mode amongst the plurality of lighting modes.

Preferably, the microcontroller may be configured to gradually vary the at least one light emission characteristic of the at least one cool white LED, the at least one warm white LED and/or the at least one RGB LED over a time period in the range of approximately 0.1-5.0 seconds.

In a third broad form, the present invention provides an illumination device including:
at least one LED configured for switchable operation between at least a first lighting mode in which the at least one LED outputs a first light emission characteristic, and, a second lighting mode in which the at least one LED outputs a second light emission characteristic;
wherein the LED is configured to switch operation between the first lighting mode and the second lighting mode by gradually varying its output from the first light emission characteristic to the second light emission characteristic.

Preferably, the present invention may include at least one RGB LED, at least one warm white LED and at least one cool white LED configured for switchable operation between at least a first lighting mode in which the at least one RGB LED, the at least one warm white LED and the at least one cool white LED outputs first light emission characteristics, and, a second lighting mode in which the at least one RGB LED, the at least one warm white LED and the at least one cool white LED outputs second light emission characteristics, wherein, the at least one RGB LED, the at least one warm white LED and the at least one cool white LED are configured to switch operation between the first lighting mode and the second lighting mode by gradually varying their outputs from the first light emission characteristics to the second light emission characteristics.

Preferably, the at least one LED may be configured to gradually vary its output from the first light emission characteristic to the second light emission characteristic over a time period in the range of approximately 0.1-5.0 seconds.

Preferably, the at least one light emission characteristic may include a chromatic characteristic or a brightness characteristic.

In a fourth broad form, the present invention provides a method operable using an illumination device having at least one LED configured for switchable operation between at least a first lighting mode in which the at least one LED outputs a first light emission characteristic, and, a second lighting mode in which the at least one LED outputs a second light emission characteristic;
wherein the method includes a step of switch operation of the at least one LED between the first lighting mode and the second lighting mode by gradually varying its output from the first light emission characteristic to the second light emission characteristic.

BRIEF DESCRIPTION OF THE DRAWINGS

The present invention will become more fully understood from the following detailed description of a preferred but non-limiting embodiment thereof, described in connection with the accompanying drawings, wherein.

DETAILED DESCRIPTION OF THE PREFERRED EMBODIMENTS

Figure 1:
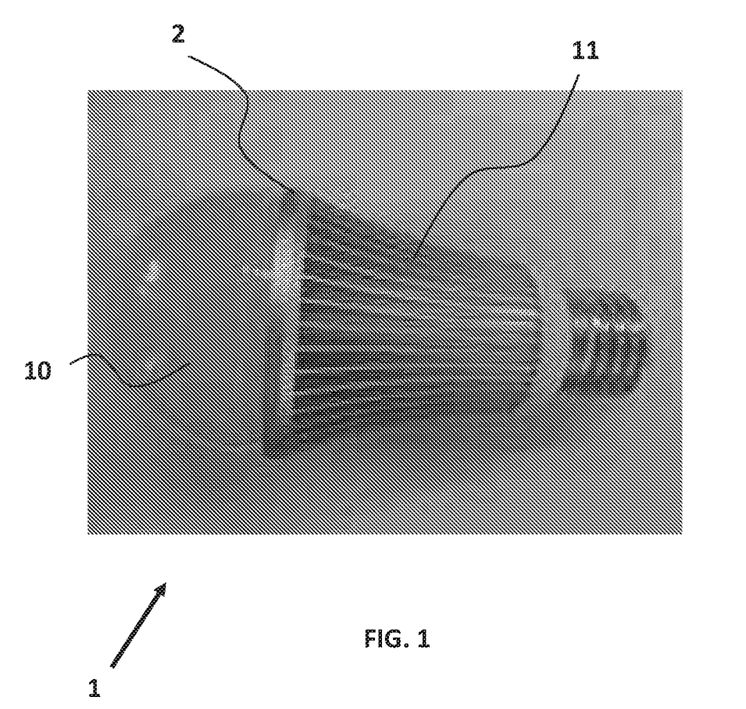
FIG. 1 depicts an exemplary compact LED lamp module in accordance with an embodiment of the present invention.

Preferred embodiments of the present invention will now be described herein with reference to the FIGS. 1 to 8. Such embodiments are implemented in the form of a compact LED lamp module (1) as depicted in FIG. 1.

Figure 5:
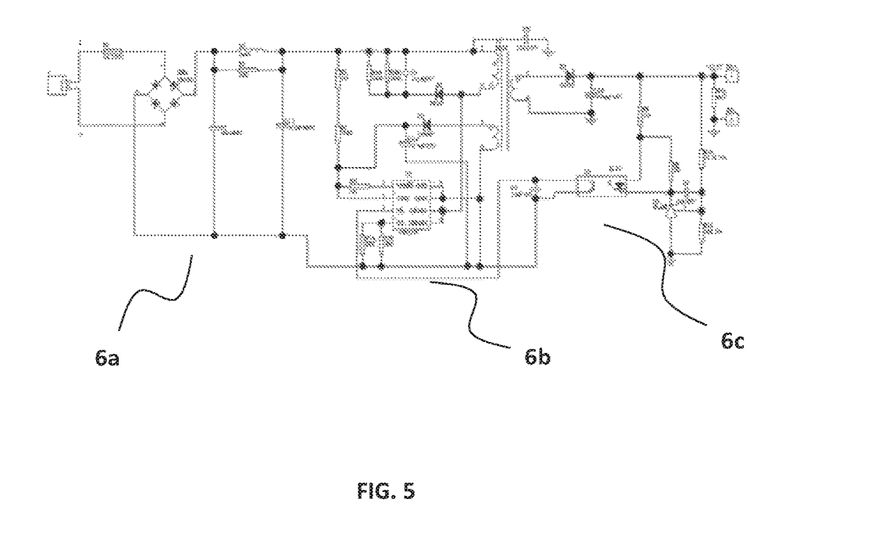
FIG. 5 shows an exemplary input rectifier circuit, input filter circuit, fly-back primary circuit and fly-back secondary and feedback circuit of an embodiment of the present invention.
Figure 6A:
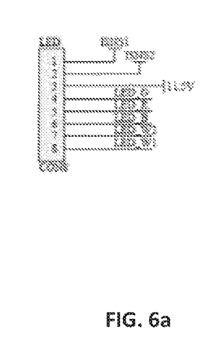
FIGS. 6a, 6b and 6c respectively depicts an LED output pin layout, a microcontroller integrated circuit and an infra-red receiver circuit of an embodiment of the present invention.
Figure 6B:
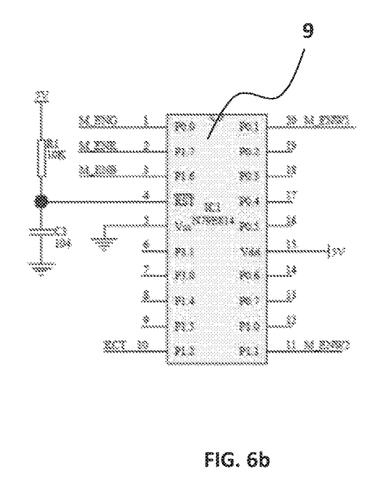
Figure 6C:
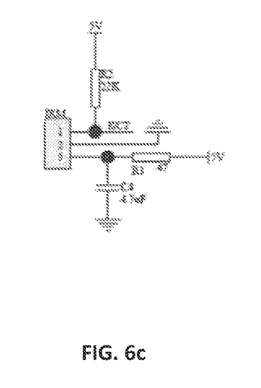
Figure 7:
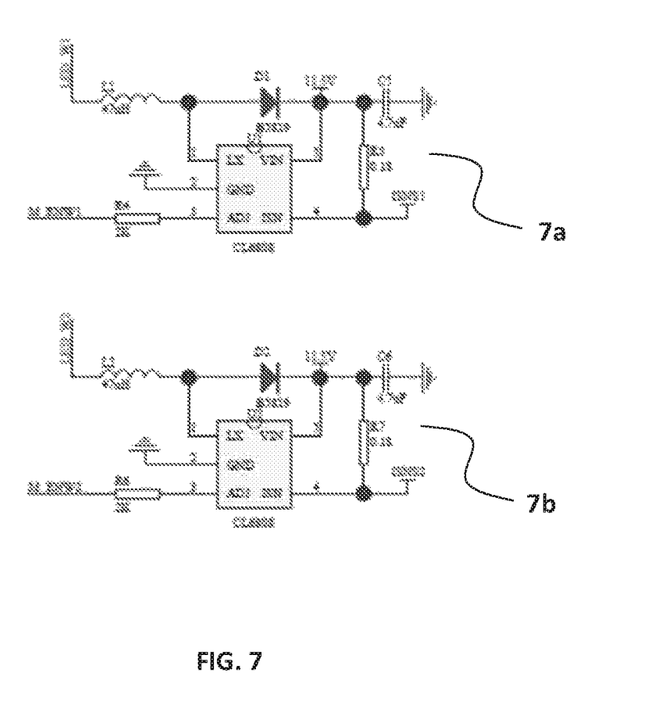
FIG. 7 depicts constant current drivers to warm white LEDs and cool white LEDs in an embodiment of the present invention.
Figure 8:
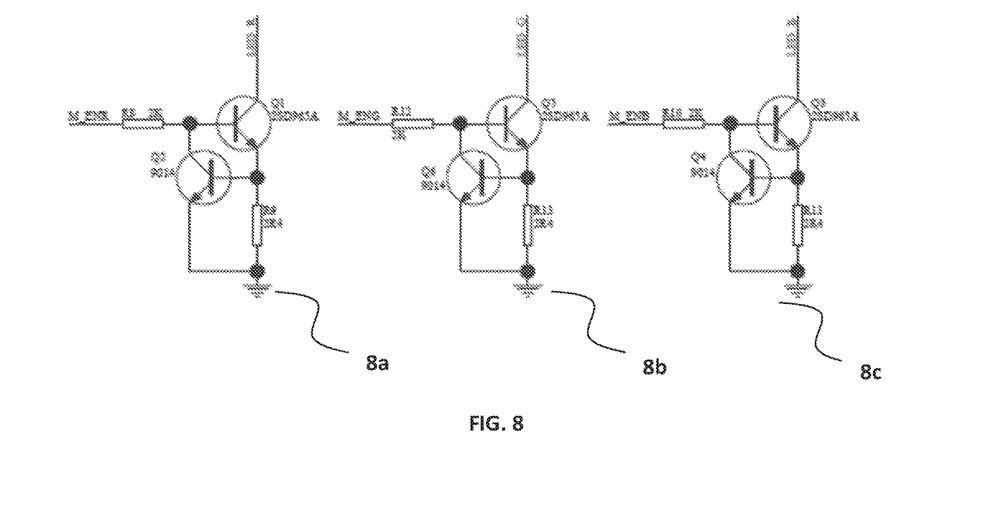
FIGS. 8a, 8b and 8c depict driver circuits to the RGB LEDs of an embodiment of the present invention.

In accordance with an embodiment of the present invention, the LED lamp module (1) includes a substantially circular-shaped metal-core printed circuit board (MCPCB) (2) upon which are mounted a plurality of warm white LEDs (3), a plurality of cool white LEDs (4) and a plurality of RGB LEDs (5). The LED lamp module (1) in accordance with the preferred embodiments are powered by a main AC supply which is suitably rectified filtered and regulated by a circuit such as depicted in FIG. 5 which includes an input rectifier circuit (6a), fly-back primary circuit (6b), and fly-back secondary and feedback circuit (6c). The warm white LEDs (3) and the cool white LEDs (4) are driven by exemplary driver circuits (7a,7b) shown in FIG. 7 whilst the RGB LEDs (5) are driven by driver circuits (8a, 8b and 8c) as depicted in FIG. 8. The LED lamp module (1) also includes a microcontroller (9) module as depicted in FIG. 6b, for instance as implemented by use of an N79E814 integrated circuit chip, which is programmed to output control signals for controlling the various groups of warm white LEDs (3), the cool white LEDs (4) and the RGB LEDs (5) to control their output light emission characteristics. An exemplary circuit for depicting output pins to the LEDs is shown in FIG. 6a whilst an infra read receiver circuit of the device is shown in FIG. 6c.

The plurality of warm white LEDs (3) are each operable to represent correlated colour temperatures approximately in a range of between 2200K-3500K whilst the plurality of cool white LEDs (4) are each operable to represent correlated colour temperatures approximately in a range of between 4500K-7000K. In the preferred embodiments, by way of example, the warm white LEDs (3) are operable substantially at colour temperatures of around 2500K whilst the cool white LEDs (4) are operable substantially at colour temperatures of around 6500K.

A diffusion cover (10) is configured for encapsulating the various LEDs (3,4,5) mounted on the MCPCB (2) and assists in providing substantially homogenous colour mixing of light emitted from the various groups of LEDs (3,4,5) as the light radiates away from the MCPCB (2) and passes through the diffusion cover (10). In the preferred embodiments, the diffusion cover is provided in the form of a frosted blister cover made of either glass or a plastic material. Advantageously, the LED output capacity that may be provided by virtue of the novel LED layout (described below) allows for a beam angle of greater than 180 degrees in certain embodiments to be radiated away from the compact LED lamp by employing a suitably shaped and dimensioned diffusion cover to facilitate such a beam angle.

Figure 2:
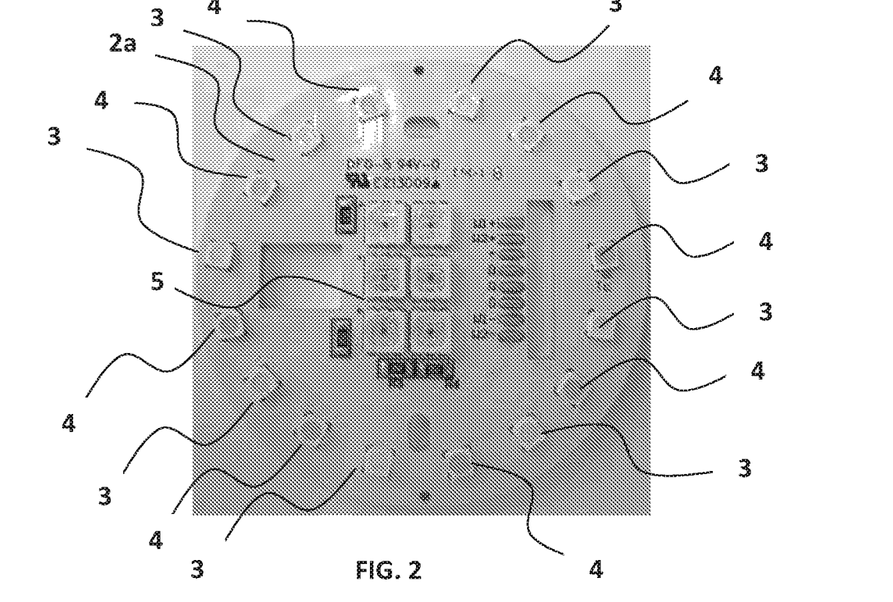
FIG. 2 depicts a first surface of a metal-core printed circuit board (MCPCB) of an embodiment of the present invention in which a plurality of warm white LEDs, cool white LEDs and RGB LEDs are mounted thereon in a novel layout.
Figure 3:
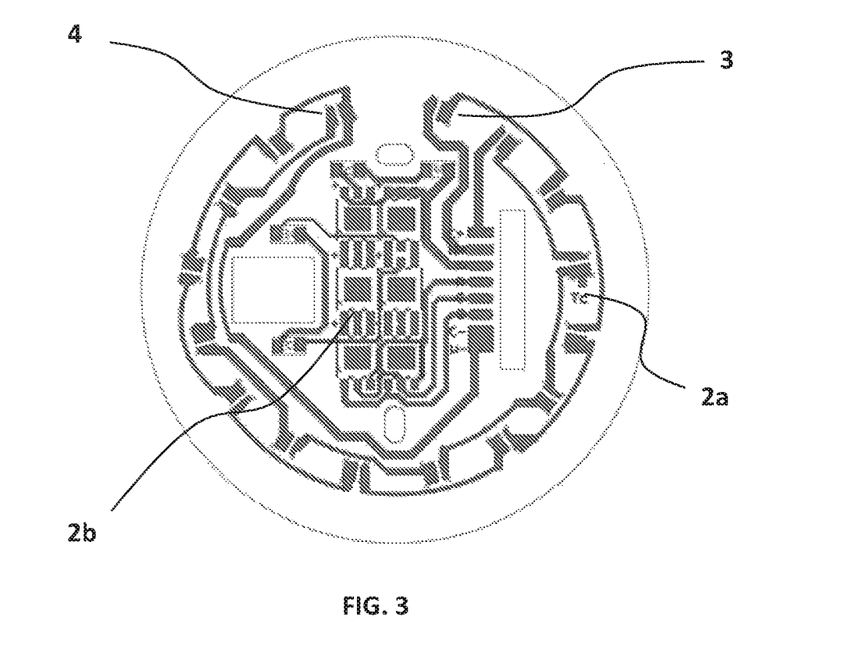
FIG. 3 depicts a reverse surface the MCPCB of FIG. 2 in which the wiring layout is shown.
Figure 4:
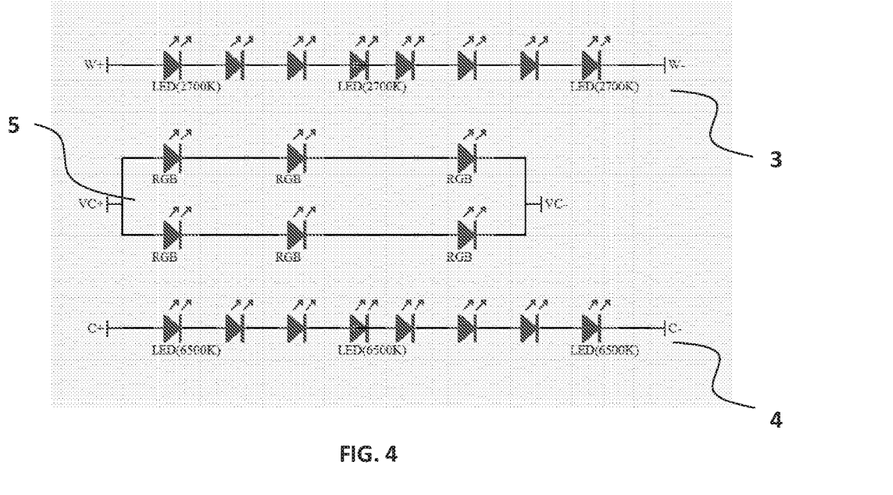
FIG. 4 depicts an LED diagram of embodiments of the present invention.

More specifically, in the preferred embodiments, 8 warm white LEDs (3) and 8 cool white LEDs (4) are mounted around a peripheral region (2a) of the MCPCB (2) in alternating fashion to form an annular configuration. The alternating of the warm white LEDs (3) with the cool white LEDs (4) assists in allowing for a relatively even distribution of warm white light and cool white light emissions radiating away from the LED lamp module (1) in use. In certain embodiments, the warm white LEDs (3) may be arranged in a first annular configuration and the cool white LEDs (4) may be arranged in a second separate annular configuration, with both annular configurations being positioned substantially around the peripheral region (2a) of the MCPCB (2). In embodiments of the present invention, 6 RGB LEDs (5) are mounted in a clustered configuration in a central region (2b) of the MCPCB (2).

The novel and inventive configuration of warm white LEDs (3), cool white LEDs (4) and RGB LEDs (5) on the MCPCB (2) provides several further notable advantages in comparison to existing technology including:

(i) improved light distribution and beam angle from the LED lamp (1) due to the warm white LEDs (3) and the cool white LEDs (4) being mounted in an annular configuration on the peripheral region of the MCPCB (2) which is in relatively close proximity to the surface of the diffusion cover (10) of the LED lamp (1);

(ii) thermal dissipation of the compact LED lamp module (1) is improved due to the heat conduction path from the warm white LEDs (3) and the cool white LEDs (4) (which are the major heat source) to the ambient air via the MCPCB (2) structure being substantially minimised. By virtue of this increased thermal dissipation feature, LED lighting capacity is also increased so as to broaden the correlated colour temperature spectrum that may be rendered; and (iii) the overall quality of colour mixing of light emitted from the LED lamp module (1) is also improved due to the RGB LEDs (3) being positioned in a central region (2b) of the MCPCB (2) which is positioned relatively further away from the surface of the diffusion cover (10) so as to alleviate RGB light emissions being directly visible through the diffusion cover (10) as perceived by the human eye.

Thermal dissipation of the LED lamp (1) is further enhanced in embodiments of the present invention by thermally coupling a finned heat sink (11) structure to the MCPCB (2) such as shown in FIG. 1 which increases the overall surface area exposure of the LED lamp (1) for dissipation of heat to ambient air.

The LED lamp microcontroller module (9), is programmed to output control signals to the various groups of warm white LEDs (3), the cool white LEDS (4) and the RGB LEDs (5) to control their light emission characteristics. The microcontroller (9) in turn is operable by a remote control in infra-red communication with the microcontroller (9) such that a user may select a particular lighting mode to be effected by actuating a user-interface on the remote control. Alternatively, the user-interface of the remote control may be operable on a smartphone in the form of a downloadable software application.

In the exemplary embodiments, the chromatic characteristics, correlated colour temperature characteristics, brightness characteristics, as well as proportions of light that are emitted from the various groups of warm white LEDs (3), cool white LEDs (4) and RGB LEDs (5) channel outputs are able to be selectably varied and mixed in response to pre-programmed control signals generated by the microcontroller (9) in order to produce a range of different lighting modes. Advantageously, in the preferred embodiments, colour rendering is enhanced across a relatively broad spectrum of colour temperatures by virtue of the improved capacity to add red light from the group of RGB LEDs (5) to the existing blue and yellow light components of the cool and warm white light LED emissions (3,4). Moreover, when mixing the cool and warm colour temperatures of the white light LEDs (3,4), it may not always be possible to achieve the correct position in the colour map. However, by mixing some red light from the RGB LEDs (5) with light emissions from the warm and cool white LEDs (3,4), it is now possible to "fine tune" the SDCM to be within and SDCM of 6 steps or less which provides an acceptable colour tolerance level perceptible to the human eye. The ratio of the red colour light that is required to be added to the light emissions from the warm and cool white LEDs (3,4) to fine tune them to within an acceptable SDCM can be conveniently pre-programmed in to the microcontroller (9) such that with the given colour range of the warm and cool white LEDs (3,4), the mixed effect can be controlled within an expected range.

By way of example, the microcontroller (9) is configured to output a control signal to the various groups of LEDs (3,4,5) to produce a lighting mode in which light from the group of warm white LEDs (3) (each operable at 2700K) and red light from the group of RGB LEDs (5) are mixed to output a resulting correlated colour temperature of 2200K from the illumination device. Other lighting modes which may be produced by embodiments of the present invention include:

(a) a "night light" lighting mode in which the proportions of red light from the RGB LEDs (5) to white light from the warm white LEDs (3) ranges from approximately 1:10 to 1:1 and the luminous flux ranges from approximately 2 to 7 lm. This particular lighting mode is perceived to evoke a "quiet night" atmosphere.

(b) a "sleeping light" lighting mode in which the proportions of white light from the group of warm white LEDs (3) to white light from the group of cool white LEDs (4) ranges from approximately 1:1 to 3:1 and the luminous flux ranges from approximately 250 to 820 lm for maximum brightness. The brightness is reduced slowly until the light goes out. This lighting mode is perceived to assist in providing a more comfortable sleep.

(c) a "working light" lighting mode in which the proportions of white light from the warm light LEDs (3) to white light from the cool white LEDs (4) ranges from approximately 1:1 to 3:1 and the luminous flux ranges from approximately 345 to 1055 lm.

(d) a "relaxation light" lighting mode in which the proportions of red light and green light emitted from the group of RGB LEDs (5) and white light emitted from the group of warm white LEDs (3) ranges from approximately (10~16):(5~15):(30~80) and the luminous flux ranges from approximately 130 to 450 lm. This lighting mode is perceived to assist in creating a comfortable and relaxing lighting atmosphere.

(e) a "sunrise wake up" lighting mode in which the proportions of white light emitted from the group of warm white LEDs (3) to white light emitted from the group of cool white LEDs (4) ranges from approximately 1:2 to 3:2 and the luminous flux ranges from approximately 280-880 lm for maximum brightness. The brightness reaches maximum within 20 minutes. This lighting mode is perceived to provide a pleasant experience when waking up.

(f) a "pastel mood" lighting mode in which red, green and blue light emitted from the group of RGB LEDs (5) are mixed and gradually changed in combination with light of relatively low-brightness emitted from the group of cool white LEDs (4). This lighting mode is perceived to provide a gentle colour change atmosphere.

(g) a "partying" lighting mode in which red, green and blue light emitted from the group of RGB LEDs (5) change suddenly. This lighting mode is perceived to provide the passion and gaiety of a party atmosphere due to the rhythmical random changes in coloured lighting.

(h) a "tropical sunset" mode in which proportions of red light and green light emitted from the group of RGB LEDs (5) to white light emitted from the group of warm white LEDs (3) ranges from approximately (30~33): (8~14):(2~4) to (36~40):(21~27):0. It is perceived that this lighting mode may assist in creating a quiet atmosphere representative of evening twilight from the sunset to the night.

(i) a "forest hiking" lighting mode in which the proportions of red light, green light, and blue light emitted from the group of RGB LEDs (5) to white light emitted from the group of warm white LEDs (3) is approximately (10~20):(80~132):(0.1~1):(30~42) and the luminous flux ranges from approximately 56 to 190 lm. White light emitted from the group of warm white LEDs (3) changes in a wave-like manner to create a perception of a forest atmosphere for relaxation.

(j) a "lapping water" lighting mode in which the proportions of green light to blue light emitted from the group of RGB LEDs (5) ranges from approximately (10~13): (2~3) to 100% blue light emitted from the group of RGB LEDs (5), and the luminous flux ranges from approximately 45 to 150 lm. The colors change in a wave-liked manner to create a perception of a surging ocean atmosphere.

(k) a "fireplace" lighting mode in which proportions of red light and green light emitted from the group of RGB LEDs (5) to white light emitted from the group of warm white LEDs (3) ranges from approximately (10~20): (5~10):(3~10) to (10~20):(3~8):(3~10) and the luminous flux ranges from approximately 60 to 220 lm. The effect of warm white light changing in wave-like fashion is intended to be perceived as a burning flame effect.

(l) a "romance" lighting mode in which the proportion of red light to blue light emitted from the group of RGB LEDs (5) ranges from approximately (40~40):(20~28) to (65~70):(10~12) and the luminous flux ranges from approximately 68 to 80 lm. It creates romantic atmosphere.

Embodiments of the present invention are also configured to effect a gradual variation of the light emission characteristics such as chromatic characteristics and brightness characteristics of each LED when switching from one steady lighting mode to another. This assists in providing a smooth transition from one steady lighting mode to another which is pleasant to the human eye in comparison to step change transitions which are provided by existing lighting devices.

By way of example, in the preferred embodiments where 5 channels of LED outputs are provided in respect of the red, green, and blue light emission channels from the cluster of RGB LEDs (5), a warm white light emission channel from the cool white LEDs (3), and a cool white light emission channel from the warm white LEDs (4), the driving current of each LED output channel is configurable to be gradually increased or decreased in a continuous and smooth manner in order arrive at the requisite output light emissions characteristics for respective channels defined by the relevant lighting mode.

In these embodiments, the smooth continuous change in the LED output channels is effected from one steady light mode to another over a time period of between 0.1-5.0 seconds. Whilst in these embodiments, each output LED channel are gradually varied concurrently over the same time period, it is possible that each channel output could be gradually varied over different time periods and in succession rather than concurrently. The switching time curve can be also be configured in linear or any other continuous mode as long as the resulting effect is that a smoother, continuous and overall more comfortable user experience is provided which minimises instantaneous changes perceptible to the human eye.

In order to gradually vary the driving current of an LED output channel so as to increase or decrease the lighting characteristics from one steady lighting to another, any number of suitable techniques could be employed. For instance, this could be accomplished by suitably varying the conduction angle of the input AC supply voltage applied to the light emitting device.

The continuous and smooth gradual variation between lighting modes assists in alleviating glaring effects which ordinarily may typically arise as a result of instantaneous switching from a relatively low brightness lighting mode to a relatively strong brightness lighting mode, as well as, alleviating darkening effects when dimming LED output channels instantaneously. This feature can also be applied to alternative embodiments employing more or less than 5 LED output channels with relative ease so as to provide continuous and smooth transitions during color mixing and brightness dimming applications.

Advantageously in embodiments of the present invention, and in the context of compact and integrated light emitting diode (LED) illumination devices, the microcontroller can be programmed to automatically and gradually vary multiple lighting characteristics (e.g. chromatic characteristics, brightness, and so on) of multiple LED channels in multiple directions (i.e. increasing or decreasing) simultaneously so as to provide smooth and continuous changing of lighting characteristics from a first lighting mode to that of a second lighting mode. In contrast, and in the context of compact and integrated light emitting diode (LED) illumination devices, such functionality is not provided by lighting dimmers of existing lighting systems which tend to be limited to manual variation of only a single lighting characteristic (e.g. intensity/brightness) in respect of only a single lighting element, and, in only a single direction at any given time (i.e. brighter or darker).

In alternative embodiments of the present invention, other thermally-conductive LED mounting platforms could be used instead of a MCPCB. For instance, a ceramic printed circuit board could be utilised instead.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. An illumination device including:
    an LED mounting platform having a peripheral region and a center;
    LEDs mounted in the LED mounting platform and including a plurality of warm white LEDs operable to represent a correlated color temperature of approximately 2500K and a plurality of cool white LEDs operable to represent a correlated color temperature of approximately 6500K, said plurality of warm white LEDs and cool white light LEDs being mounted in a substantially annular configuration around the peripheral region of the LED mounting platform in alternating positions, and, a plurality of RGB LEDs mounted in a cluster at the center of the LED mounting platform;
    a diffusion cover configured to allow light emitted from the plurality of warm white LEDs, the plurality of cool white LEDs, and the plurality of RGB LEDs to pass therethrough as a homogenous mixed light emissions having a beam angle of at least 180 degrees;
    said LED mounting platform including a thermally-conductive substrate integrally formed with the LED mounting platform that is configured for providing a thermal conduction path via which heat energy produced by the plurality of warm white LEDs and the plurality of cool white LEDs mounted around the peripheral region of the LED mounting platform, is able to be thermally conducted away to ambient air external of the illumination device; and
    a microcontroller configured for varying at least one light emissions characteristic of light emitted from at least one of the plurality of warm white LEDs, the plurality of cool white LEDs and the plurality of RGB LEDs, in response to a wireless user control signal transmitted to the microcontroller via a remote control device so as to produce a plurality of lighting modes and wherein to produce at least a first lighting mode from amongst the plurality of lighting modes the microcontroller is configured to vary the at least one light emission characteristic such that the proportion of light emitted from the plurality of warm white LEDs to light emitted from the plurality of cool white LEDs ranges from approximately 1:1 to 3:1 and wherein the microcontroller is configured to gradually reduce the luminous flux produced by the plurality of warm white LEDs and the plurality of cool white LEDs from a relative maximum luminous flux setting associated with the first lighting mode to a relative minimum luminous flux setting associated with the first lighting mode.

2. An illumination device as claimed in claim 1 wherein the LED mounting platform includes a thermally-conductive substrate such as a metal-core printed circuit board (MCPCB) or a ceramic printed circuit board.

3. An illumination device as claimed in claim 1 including a heat sink configured for dissipating thermal energy from the illumination device.

4. An illumination device as claimed in claim 3 wherein the heat sink is thermally coupled to the LED mounting platform.

5. An illumination device as claimed in claim 1 wherein the at least one light emission characteristic that is selectably varied includes at least one of:
   (a) a chromatic characteristic of light emitted from at least one of the plurality of cool white LEDs, the plurality of warm white LEDs, or the plurality of RGB LEDs;
   (b) a correlated color temperature characteristic of light emitted from at least one of the plurality of cool white LEDs, the plurality of warm white LEDs, or the plurality of RGB LEDs;
   (c) a brightness characteristic of light emitted from at least one of the plurality of cool white LEDs, the plurality of warm white LEDs, or the plurality of RGB LEDs; and
   (d) at least one of a proportion of chromatic, correlated color temperature, or brightness characteristics of light emitted from at least one of the plurality of cool white LEDs, the plurality of warm white LEDs, or the plurality of RGB LEDs.

6. An illumination device as claimed in claim 1 wherein the microcontroller is configured to gradually vary the at least one light emission characteristic of at least one of the plurality of cool white LEDs, the plurality of warm white LEDs, or the plurality of RGB LEDs in order to switch from a first lighting mode to a second lighting mode amongst the plurality of lighting modes.

7. An illumination device as claimed in claim 6 wherein the microcontroller is configured to gradually vary the at least one light emission characteristic of at least one of the plurality of cool white LEDs, the plurality of warm white LEDs, or the plurality of RGB LEDs over a time period in the range of approximately 0.1-5.0 seconds.

\* \* \* \* \*